United States Patent [19]

Balzano et al.

[11] Patent Number: 4,802,866
[45] Date of Patent: Feb. 7, 1989

[54] CONNECTOR

[76] Inventors: Alfiero Balzano, 4333 Sunny La., Yorba Linda, Calif. 92680; Dan Dove, 2102 Chateau, Anaheim, Calif.

[21] Appl. No.: 83,070

[22] Filed: Aug. 10, 1987

[51] Int. Cl.⁴ .............................................. H01R 13/04
[52] U.S. Cl. ....................................................... 439/496
[58] Field of Search ................................. 439/492–496

[56] References Cited

U.S. PATENT DOCUMENTS 3,154,365  10/1964  Crimmins ............................ 439/496

Primary Examiner—Joseph H. McGlynn
Attorney, Agent, or Firm—Roger A. Marrs

[57] ABSTRACT

A two-piece solderless connector is disclosed herein having a first member formed with a cavity supporting a leaf spring over which a strip of plastic backed electrical conductors are carried so that the strip is folded over upon itself to define a contact closure between opposing surfaces of electrical conductors. Opposite ends of the conductors within the cavity terminate at an elongated opening constituting an entrance leading into the cavity for insertably receiving similar electrical conductors projecting from a second member of the connector. Resilient biasing members urge the conductors together. The connector conductors of both the first and second members provide an integral part of a flex circuit and the electrical conductors of each member are integral with separate and individual circuit conductors included in the over-all flex circuit.

2 Claims, 1 Drawing Sheet

CONNECTOR

BACKGROUND OF THE INVENTION

1. Field of the Invention

The present invention relates to the field of electrical connectors and more particularly to a solderless connector having conductors that are an integral part of flex circuitry intended to be coupled together.

2. Brief Description of the Prior Art

As the usefulness of electronic equipment has expanded with the increase in technological improvement and with the widening demand, both militarily and commercially for equipment capable of handling vast quantities of information at increased rates of speed, the need for high density electronic packaging has become of increasing importance. A concomitant of this trend is the need for circuit protection and miniaturization which, while providing the requisite component density, maintains both system reliability and serviceability. Under the thrust of this expanding use, it has become an economic necessity to provide a circuit component construction which is of reduced density and which includes interconnecting means for coupling into the electronic equipment which both minimizes the possibility of error in field maintenance procedures and reduces overall system complexity.

With increasing component packaging design, the reliability of circuit interconnections has become of paramount significance. Particularly, this is true with respect to the design, construction and interconnection of circuit components and assemblages which carry out the basic work function of the electronic equipment utilizing flex circuitry. Conventionally, electrical circuit networks employ a wide strip of plastic encased, spaced apart electrical conductors which is known as a flex cable or flex circuit. Joining terminating ends of such cables so that appropriate conductors are both mechanically and electrically connected generally requires soldering the ends of the conductors to pins, terminals or the like. Such a procedure is very expensive, time-consuming and labor intensive. Attempts have been made to avoid the soldering procedure which contemplates piercing or crimping a pin to the conductor; however, these procedures have been found to be unreliable and to result in intermittent connection.

Therefore, a long-standing need has existed to provide an integral connector joining a plurality of conductors together in a flex circuit without the necessity of soldered connections or joints.

SUMMARY OF THE INVENTION

Accordingly, the above problems and difficulties are obviated by the present invention which provides a novel integral connector of two-piece construction having first and second members carried at opposing ends of a conventional flex circuit which terminates in a plurality of electrical, spaced apart connectors. One member of the connector includes a cavity having the end of the flex circuit folded over upon itself to provide opposing surfaces constituting a closure for the connector while the other flex circuit is folded over a projecting portion of the second member exposing the electrical connectors so as to constitute the other half or portion of the contact closure intended to be insertably received into the cavity of the first member. Spring biasing means are carried within the cavity of the first member so as to bear against a portion of the flex circuit to forcibly urge the electrical connectors into the contact closure position with the electrical connectors of the other flex circuit. Each member of the connector is composed of a plastic block which is formed in two parts that are placed at about the end of each of the respective flex circuits and that are joined together by adhesive or ultrasonic bonding so that the ends of the flex circuit place the respective electrical conductors in the aforementioned positions. The respective spaced apart electrical conductors form a part of the flex circuits by being imbedded in an insulative member such as a film or layer of plastic material whereby the end of the flex circuit is unitary in construction and may be readily folded over upon itself within the respective cavity and respective projection of the connector members. The insulative film or layer of material is removed to expose the opposing surfaces of conductors within the cavity and about the external surface of conductors carried on the projection.

Therefore, it is among the primary objects of the present invention to provide a novel electrical connector which is integral with the conductors carried on a flex circuit so as to be integral therewith and which does not employ soldering, crimping or piercing procedures.

Another object of the present invention is to provide a novel electrical connector which is unitary in its construction and either flexible or rigid, and is integrally formed with the electrical conductors carried on the ends of a circuit cable.

Still another object of the present invention is to provide a novel integral flex circuit connector for joining the respective electrical conductors carried on opposing ends of a flex cable or circuit which is inexpensive to manufacture and which provides reliable mechanical and electrical connection therebetween.

Yet another object resides in providing a double or single spring means for urging the opposing conductors of a socket connector together intending to insertably receive a mating connector plug.

BRIEF DESCRIPTION OF THE DRAWINGS

The features of the present invention which are believed to be novel are set forth with particularity in the appended claims. The present invention, both as to its organization and manner of operation, together with further objects and advantages thereof, may best be understood by reference to the following description, taken in connection with the accompanying drawings in which:

DESCRIPTION OF THE PREFERRED EMBODIMENT

Figure 1:
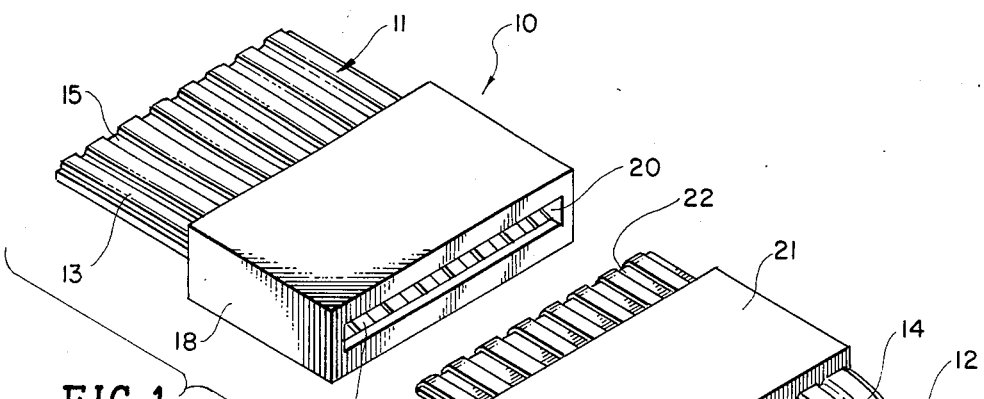
FIG. 1 is a front perspective view of the novel connector incorporating the present invention and illustrated in a position preparatory for closure.

Referring now to FIG. 1, the novel connector of the present invention is indicated in the general direction of arrow 10 which is employed for joining the opposing ends of a pair of flex circuit or cables indicated in general by numerals 11 and 12 respectively. Each flex circuit or cable comprises a plurality of parallel and spaced apart electrical conductors, such as illustrated by numeral 13 on flex circuit 11 and numeral 14 carried on flex circuit 12. The plurality of electrical conductors 13 and 14 are carried between sheets of plastic constituting insulation so that the insulation separates adjacent conductors and holds the respective conductors in position with respect to one another and as a unitized element. The insulative sheets of plastic encasing the respective connectors are broadly identified by numeral 15 on flex circuit or cable 11 and numeral 17 on flex circuit or cable 12.

Referring further to FIG. 1, it can be seen that the end of flex circuit 11 terminates in a first connector member 18 which is of sufficient length to accommodate the width of the flex circuit 11. Member 18 accepts the end of flex 11 through one end thereof while the opposite end of the member is provided with an opening 20 serving as an entrance leading into an internal cavity within the member 18. Also, it can be seen that the end of flex circuit 12 terminates through one side of a second member identified as numeral 21 which is provided with a cantilevered projection 22 outwardly extending from the side of member 21 opposite to its side receiving the flex circuit or cable 12. The plurality of electrical conductors carried on the flex circuit 12 are arranged in fixed parallel spaced apart relationship in a similar fashion to the arrangement of electrical conductors on flex circuit or cable 11. A plastic or insulated sheet is carried about the arrangement of conductors so that they are held in a unitary arrangement and are insulated from one another. However, it is to be noticed that with respect to member 21, the plurality of conductors extend beyond the side of the member to fold about the projection 22 and that the insulation on the one side of each of the conductors is removed so as to expose the conductor for mechanical and electrical engagement with a mated and exposed conductor within the cavity of the member 18. Therefore, the connector 18 may be broadly referred to as a female connector while the member 21 may be broadly considered a male connector so that when properly joined, the members provide an overall integral connection between the respective ends of the electrical connectors carried by the flex circuits 11 and 12 respectively.

Figure 2:
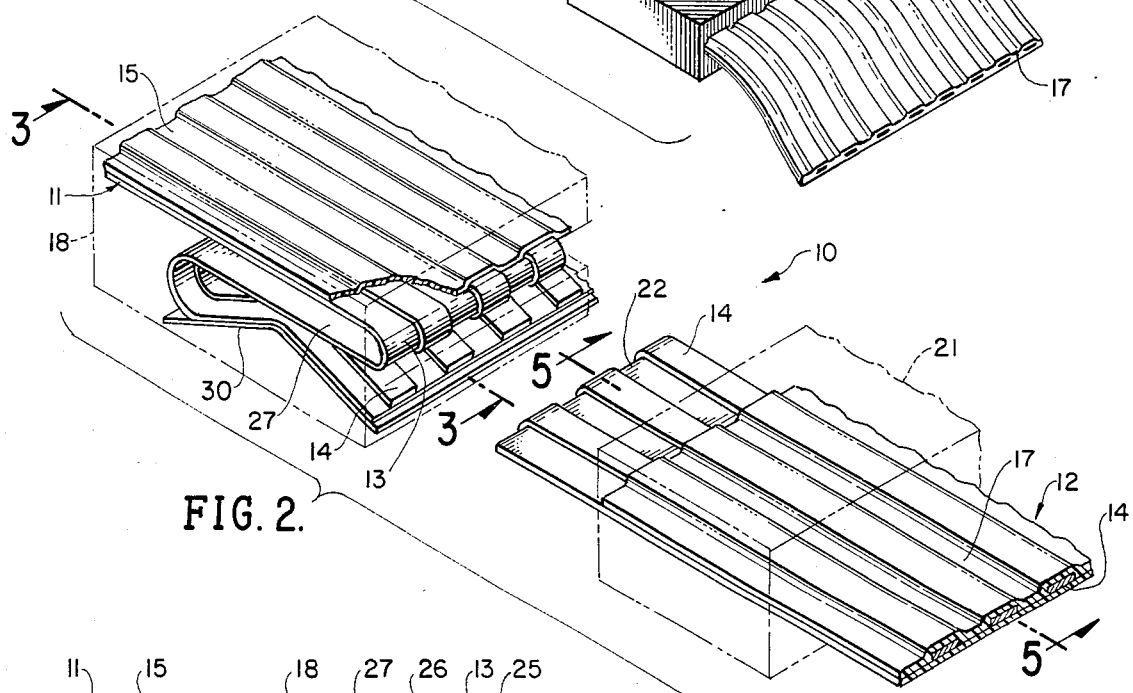
FIG. 2 is a view similar to the view of FIG. 1 having the respective connector members broken away to illustrate the electrical connectors carried on the respective flex circuit or cables.
Figure 3:
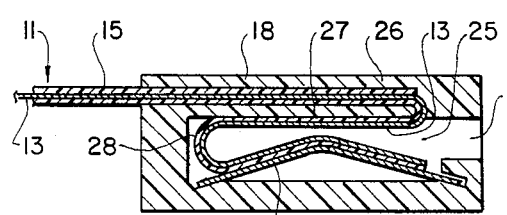
FIG. 3 is a transverse cross-sectional view of the first member of the connector taken in the direction of arrows 3—3 of FIG. 2 showing a single spring biasing closure.

Referring now in detail to FIGS. 2 and 3, it can be seen that the connector member 18 includes an end portion of the flex cable circuit 11 which is folded over upon itself within the internal cavity which is broadly identified by numeral 25 in FIG. 3. The end of the flex cable 11 is initially trained through an upper portion 26 of the member 18 and folded about an internal mass 27 so that an exposed portion of the conductor part faces the cavity 25.

It can be seen that the flex cable or circuit 11 is initially trained about mass 27 so that the circuit strip or cable is folded about itself a first time and then within the cavity 25 is folded back upon itself again to form a curvature 28 where the terminating end of the cable 11 is passed over a resilient means taking the form of a leaf spring 30. The leaf spring has its opposite ends touch or embedded into the opposite corners of the member 18 forming the cavity 25 The leaf spring is bowed or bent past center so as to normally bias the terminating end of the flex circuit 11 towards the opposite portion of the flex cable. However, a space resides between the two opposing surfaces which is to accept the projected end of the member 21 within the cavity 25. It is also to be noted that the insulation is removed from the electrical conductors so as to expose their opposing surfaces within the cavity 25. Thus, a portion of a two-piece closure means is provided by the exposed surfaces of the plurality of conductors within the cavity 25 wherein a portion of the conductors are spring-biased towards one another by the leaf spring 30. The leaf spring provides enough force to urge good mechanical and electrical connection between the respective conductors carried by the members 18 and 21 when insertion occurs within the cavity 25 by exposed conductors about the projection 22 of the member 21.

Figure 5:
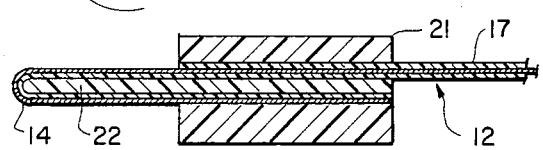
FIG. 5 is a transverse cross-sectional view of the second member of the connector illustrated in FIG. 2 as taken in the direction of arrows 4—4 thereof.

Referring now in detail to FIGS. 2 and 5, the member 21 is illustrated wherein the flex circuit or cable 12 is trained about the projection 22 outwardly extending from one end of the body of the member 21. The flex cable is exposed on the portion of the cable outwardly extending from the body 21 where the insulative material 17 has been removed. The extreme terminating portion of the cable or circuit 12 is imbedded within the body of the member 21 so that the circuit or cable 12 is integrally provided on the projection 22.

Figure 4:
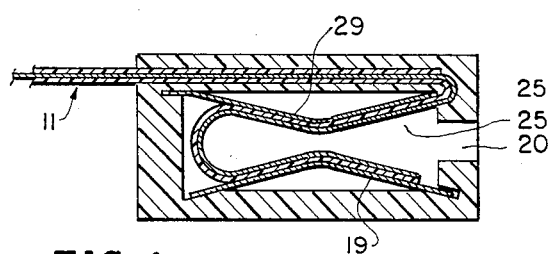
FIG. 4 is a view similar to the view of FIG. 3 showing a double spring biasing closure.

In FIG. 4, another version of the invention is shown in which a pair of springs 19 and 29 are employed to forceably urge or bias the opposing connector conductors towards each other. The applied force is yieldable so that the conductors spread as the projections of the plug are forced into the cavity 25. It is within the inventive concept to employ a spring biasing means that applies a yieldable force from both the upper and lower sides of the cavity 25 as well as from just one side as shown in FIG. 3.

Also, it is to be understood that a single conductor plug and socket may be constructed which is rigid and may be referred to as a pin connector. Instead of a plurality of conductors as shown in FIGS. 1 and 2, a single projection and a single socket may be used. FIGS. 3, 4 and 5 may represent such a single and rigid construction. The flex cable may be a rigid cable for this embodiment.

Therefore, it can be seen that the two-piece connector of the present invention provides a male and female component or plug and socket which may be readily joined together to provide a proper mechanical and electrical connection between exposed portions of a plurality of electrical conductors carried at the ends of a flex circuit 11 and another flex circuit 12 respectively. No solder, piercing or crimping procedures or techniques are involved. The connector closure contacts are an integral part of the flex circuit itself. The individual circuit paths via the conductors are extended into a geometry of parallel finger contacts. In the area of the finger contacts, the flex circuit is folded over upon itself and wrapped around portions of the molded connector member or body to form a socket in the instance of member 18 or a positive contact connecting interface with the projections of the member 21. The contact fingers or exposed portions of the conductors are always supported or carried on an insulating substrate or base film or insulative sheets. The substrate, base film or insulative sheet is an integral part of the flex circuit 11 and 12 respectively. In the socket configuration shown in FIGS. 2 and 3, the finger contacts may be backed with additional spring pressure, as shown in FIG. 4, to attain designed contact pressure or interface between inter-connecting conductors and the springs may be metal or plastic composition.

The bodies of the connector members 18 and 21 are intended to be multi-piece construction and may be ultra-sonically or solvent welded or bonded together about the respective portions of the flex circuit 11 and 12 to provide the desired foldings and configurations shown in FIGS. 3 and 5. The respective electrical conductors may be composed of copper or other electrically conducted materials while the insulating sheets or film covering the conductors may be of a Kapton base film or other plastic composition.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed is:

1. A solderless electrical connector for releasably joining opposite ends of multiple contact flexible circuitry comprising:

a first and second length of flexible circuitry having a plurality of electrical conductors carried along their lengths in insulative fixed parallel spaced-apart relationship;

a form defining an open cavity for supporting said first length of flexible circuitry so that said first length of flexible circuitry is folded over upon itself to define a contact closure between opposing surfaces of exposed electrical conductors;

resilient leaf spring means carried on said form within said form cavity yieldably urging said contact closure together, said resilient means comprising a pair of elongated V-shaped members having their opposite terminating ends anchored in said form with a single free end slidably carried on a sloping ramp with the apex of said V-shaped member movably projecting into said form cavity to support said first length of flexible circuitry; and a projection for supporting said second length of flexible circuitry so that said second length of flexible circuitry is folded over said projection to define exposed electrical conductors for mating with electrical conductors of said contact closure when said projection is inserted into said form cavity.

2. The invention as defined in claim 1 wherein:

said pair of V-shaped member constituting a support backing about which said first length of flexible circuitry bears against it along the length of said support backing.

\* \* \* \* \*